Dec. 20, 1966 J. G. SIMMONS ET AL 3,293,512

THIN FILM, SOLID STATE AMPLIFIER WITH SOURCE AND DRAIN ON OPPOSITE SIDES OF THE SEMICONDUCTOR LAYER

Filed Sept. 20, 1963 3 Sheets-Sheet 1

INVENTORS.
JOHN G. SIMMONS
ROBERT I. FRANK
BY Carl Fissell Jr.
AGENT

INVENTORS.
JOHN G. SIMMONS
ROBERT I. FRANK
BY
Carl Fissell Jr.
AGENT

INVENTORS.
JOHN G. SIMMONS
ROBERT I. FRANK
BY
Carl Fissell Jr.
AGENT

United States Patent Office 3,293,512

Patented Dec. 20, 1966

3,293,512
THIN FILM, SOLID STATE AMPLIFIER WITH SOURCE AND DRAIN ON OPPOSITE SIDES OF THE SEMICONDUCTOR LAYER

John G. Simmons, Norristown, and Robert I. Frank, Rosemont, Pa., assignors to Burroughs Corporation, Detroit, Mich., a corporation of Michigan Filed Sept. 20, 1963, Ser. No. 310,376
5 Claims. (Cl. 317—235)

The present invention relates to solid state electron apparatus and more particularly, although not necessarily exclusively, to solid state electron apparatus of the type employing electrical field effects to produce and control electron migration and transfer. With still more specificity, the present invention has to do with space charge limited thin film solid state electron active devices analogous to electronic vacuum apparatus, e.g., electronic vacuum tubes, diodes, triodes, etc.

It is an important object of the present invention to provide a solid state electron thin film amplifying device.

Another object of the invention is to provide a three terminal thin film active device using semi-insulating or semi-conducting films of material separating the active elements of the apparatus.

Another object of the invention is to provide a solid state thin film active device utilizing electrical field effects for the generation and control of electrons.

Still a further object of the invention is to provide a thin film analog triode field effect device wherein a high degree of amplification is obtained, by structurally multiplying the number of operative elements therein.

Another object of the invention is the provision of a novel method of fabricating thin film analog triode field effect apparatus.

In accordance with the foregoing objects and first briefly described, the present invention comprises a solid state electron field effect apparatus having means for controlling current in the output circuit thereof by a voltage or potential field at the input of this circuit, including a supporting structure having a source and drain operatively associated therewith in a manner whereby the two are separated one from the other by material making an ohmic contact to each. A blocking insulator is disposed adjacent the drain material and contiguous to a gate electrode disposed in operative relation to said blocking insulator. Application of suitable potentials to the device permits the injection of electrons from the source into the conduction band of the first mentioned insulator so that current is drawn from the source to the drain. Application of a suitable potential between the gate and the drain permits modulation of this source-drain current without drawing appreciable gate current, thereby effecting a high level of amplification.

Another and important feature of the invention in accordance with the foregoing objects, comprises a solid state electron apparatus in which a plurality of sources and drains are disposed in operative relationship with a plurality of gates, the latter being isolated therefrom by means of a blocking insulator in a manner interleaving or internesting the drains with the sources and the sources with the gates whereby an extremely high degree of amplification and a greater efficiency of operation is accomplished.

The foregoing and other additional objects and advantages of the invention will become more apparent by reference to the following description, claims and drawings in which:

A preferred embodiment of thin film analog apparatus according to the present invention comprises solid state electron active structures, the mechanism of operation of which is believed to utilize the effects of interacting electrical fields produced by the application of electrical potentials to conductive members which are suitably arranged in layer formation relative to each other and to adjacent and contiguous layers of insulating material whereby space charge limited currents are generated and in such manner as to produce amplification. The devices resulting from this invention are compatible with thin film components and with thin film integrated circuits.

Figure 2:
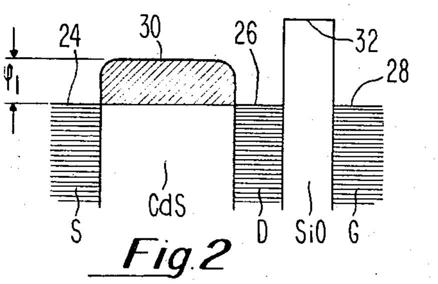
FIGURE 2 is a schematic representation of an energy level diagram for the apparatus of FIGURE 1 illustrated in the unbiased or "equilibrium" condition.
Figure 1:
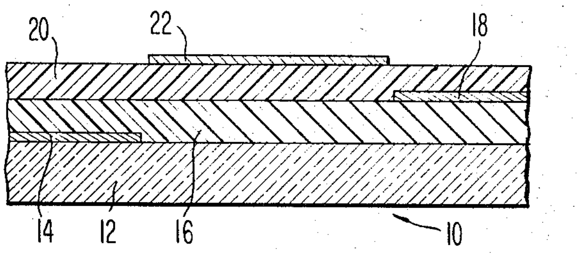
FIGURE 1 is a greatly enlarged sectionalized view of apparatus constructed in accordance with the present invention showing the "drain" adjacent the "gate" and the apparatus in the unbiased condition.

Referring first to FIGURES 1 and 2 of the drawings, one form of solid state electron active device according to the teachings of the present invention is seen in the greatly enlarged idealized view, to comprise a unitary assembly 10 including a supporting substrate layer 12 of electrically insulating material, e.g., glass, upon which one or more electrically conductive members 14 (only one being shown in FIGURE 1) are or may be disposed, as by vacuum vapor deposition. A relatively thick resistive layer 16 of insulating material, such for example, as cadmium sulphide, is disposed over the member 14. A second set of electrically conductive members 18 (only one being shown) is applied to the cadmium sulphide layer 16 after which a second insulating layer 20, e.g., of silicon monoxide, is deposited or otherwise formed over the conductors 18. Finally, a third group of conductive members 22 (only one being shown) is applied on the insulating layer 20 to complete the unitary assembly 10.

For purposes of ease in description and understanding, the conductive electrode members 14, 18 and 22 of the present apparatus are hereinafter referred to and identified as source 14, drain 18 and gate 22, respectively. These elements may for purposes of description be though of as corresponding to the cathode, plate and grid, respectively, of a conventional thermionic vacuum tube and/or to the emitter, collector and base of the well-known transistor.

The structures illustrated and described hereinafter differ from the thin film transistor in that the operation of this latter apparaus depends on unique effects, e.g., surface states, etc., in the make-up of the material forming the device, whereas the present apparatus is believed to operate entirely by means of the interaction of electric fields created within the apparatus by means hereinafter more particularly described and illustrated.

In the physical construction of a device according to the present invention, the source and drain electrodes 14 and 18 are formed of metals which make an ohmic contact with high-resistivity CdS film 16 ($\sim 10^8$ ohm/cm.) i.e., so that the barrier at the interface of the metal-cadmium sulphide juncture is low enough so as to be space charge limited not emission limited. The relatively thin film 20 of SiO, which separates the gate electrode 22 from the CdS 16 acts to prevent the gate 22 from injecting electrons into the CdS, effectively forming a blocking contact with the CdS film 16. An insulator may be defined as a member in which the number of carriers in the conduction band thereof in thermal equilibrium is small compared to the number injected from the metal electrode, e.g., the energy gap of the material is greater than 1 ev. This produces high resistivity.

As seen in the energy level diagram of FIGURE 2, the device is considered to be in thermal equilibrium, i.e., without any external bias applied thereto. The Fermi levels 24, 26 and 28 of electrodes 14, 18 and 22 are thus co-linear. The potential barrier 30 at the source CdS interface is flat while the conduction band of the SiO has zero slope.

The source and drain electrodes 14 and 18 are typically 1000–3000 A. thick and laterally separated by approximately .001″ or less. These two electrodes are vertically separated by the thickness of the CdS film 16, approximately 1 micron. The SiO layer 20 is from 1000–2000 A. thick with the gate electrode 22 1000–3000 A. in thickness. In order to reduce any capacitive effects, the gate electrode 22 is made just wide enough to cover or bridge the gap, i.e., lateral space, between the source and drain 14 and 18 respectively, FIGURE 1. The insulators may be chosen from the group including CdS, CdTe, CdSe, ZnS, ZnTe, ZnSe, GaAs and Si. The metal electrodes may be from the group including In, Al, Be, Au and Cd.

Figure 4:
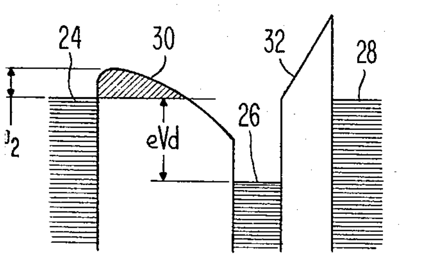
FIGURE 4 is an energy level diagram for the condition illustrated in FIGURE 3.
Figure 3:
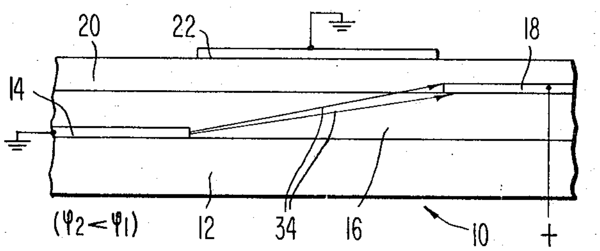
FIGURE 3 is a view somewhat similar to FIGURE 1 illustrating the apparatus with the "drain" positively biased relative to the "source," and with the "gate" at the same potential as the source.

Referring next to FIGURES 3 and 4, if a potential difference or bias is now applied between the source 14 and the drain 18, current is drawn from the source to the drain due to the electrical field produced thereby in the cadmium sulphide insulating layer. The direction of the force that this field produces upon the electrons is shown by the arrows 34. In effect, the combination of the source electrode 14 in ohmic contact with the CdS layer 16 enables actual injection of electrons from the source into the conduction band of the insulator 30. This current is limited by the space charge in the conduction band of the insulator.

For purposes of explanation, of the present invention, space charge limited current is defined as that current which flows through regions of space wherein electrons comprising this current normally would not exist. These excess injected electrons can be said to have violated the electrical neutrality of the medium through which these electrons are flowing giving rise to the electrical fields which act to alter the potential seen by the charges within the medium at the interfaces. This changes the potential barrier height, raising the same.

It is assumed for the sake of this explanation that the source is maintained at ground or earth potential. The drain is positive relative thereto and the gate electrode may be biased "positively" or negatively relative thereto. Operation with the gate positive appears to produce the greatest gain.

As seen in the energy level diagram of FIGURE 4, the Fermi level 26 of drain 18 is depressed relative to the Fermi level 24 of the source. The slope of the conduction band 32 of SiO is shifted sharply, downwardly, leftwardly due to the field in this insulator. The gradient of this slope is proportional to the field which exists in the insulator 20. It is also noted that the potential barrier 30 (height $\varphi$ 2) is reduced relative to that of ($\varphi$ 1), FIGURE 2. The gate Fermi level 28 remains substantially unaffected.

Figure 6:
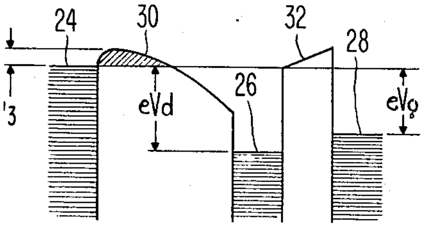
FIGURE 6 is an energy level diagram for the condition illustrated in FIGURE 5.
Figure 5:
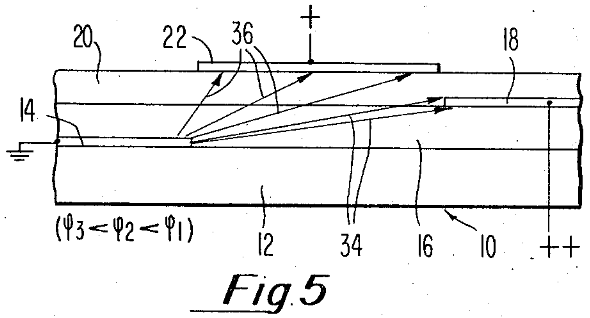
FIGURE 5 is a view similar to FIGURE 3 showing the "gate" positive with respect to the source and with the "drain" more positive than the "gate"

In FIGURES 5 and 6 it is seen that by applying a suitable bias potential (positive) to the gate electrode 22, additional lines of force 36 are produced, effectively reducing the height $\varphi 3$ of the space charge potential barrier 30 at the source-cadmium sulphide interface. The source-drain current is thus effectively modulated hence permitting either more or less current to flow, as the case may be. It is seen therefore, that the apparatus of FIGURES 5 and 6 operates as a true amplifier, since the potential applied to the gate 22 tends to modulate the current flow without drawing any appreciable current itself, thereby acting in the nature of a true thermionic grid. It follows, therefore, that with this structural arrangement a varying signal applied at the gate 22 will control a larger flow of current between the source 14 and drain 18.

The analogy to the vacuum tube is, of course, apparent. In the present apparatus there is a charge between source and drain (cathode and anode) and a space limited condition exactly as in a thermionic tube. Whereas current flows in the vacuum in the tube, in the present apparatus current flows in the conduction band of an insulator with the gate 22 acting as the grid to control and to modulate this current flow. Importantly, the present device does not rely for its operation on unique effects, e.g., creation of a conductive channel as in the thin film transistor, nor on the surface states, etc., of the materials of which the device is or may be constructed.

Figure 8:
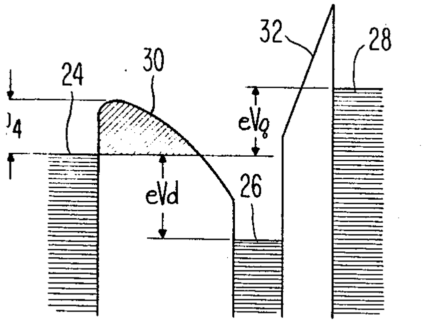
FIGURE 8 is an energy level diagram of the condition shown in FIGURE 7.
Figure 7:
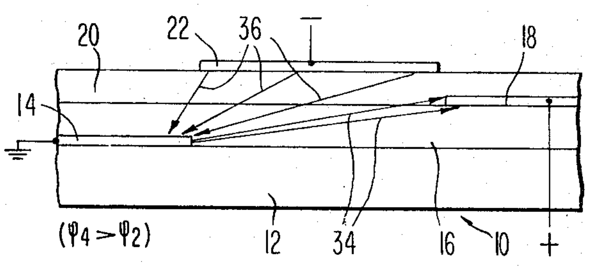
FIGURE 7 is a view similar to FIGURE 3 showing the "gate" negatively biased relative to the "source" and with the "drain" positively biased.

As seen in FIGURES 7 and 8, with the drain 18 positively biased relative to the source 14, the arrows 34 show the source-drain field effectively moving from left to right. The gate 22 is biased negatively with respect to the drain 18 causing the gate-source field arrows 36 to reverse direction. The space charge barrier 30 that exists at the source-cadmium sulphide interface is thus enhanced—or increased—making this barrier higher ($\varphi 4$). $\varphi 4$ is > than $\varphi 3$ or $\varphi 2$. The arrows 34 and 36 point in the direction of the force upon the electrons. The arrows do not represent the electrical field, which would be in the opposite direction.

Figure 10:
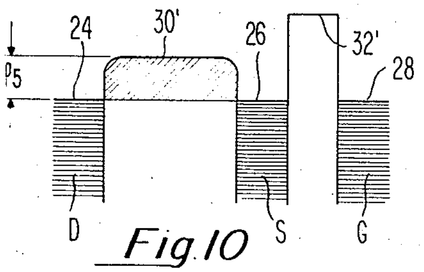
FIGURE 10 is an energy level diagram for the condition of equilibrium shown in FIGURE 9.
Figure 9:
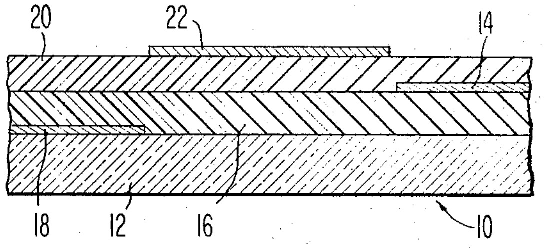
FIGURE 9 is a greatly enlarged sectionalized view of the apparatus of FIGURE 1 showing the position of the source and drain interchanged to place the "source" adjacent the "gate" with the apparatus in the unbiased condition.

FIGURES 9 and 10 illustrate a unitary assembly 10 similar in structural arrangement to that of FIGURES 1, 3, 5 and 7, but with the source and drain positions or locations relative to the gate interchanged. The source 14, while still maintained at ground or earth potential, is now located adjacent the cadmium sulphide-silicon monoxide interface. The Fermi levels 24, 26 and 28 are again co-linear as in FIGURE 2, while the potential barriers 30 and 32 are horizontal or zero slope. This represents the equilibrium condition as before—no potentials applied to the device.

Figure 12:
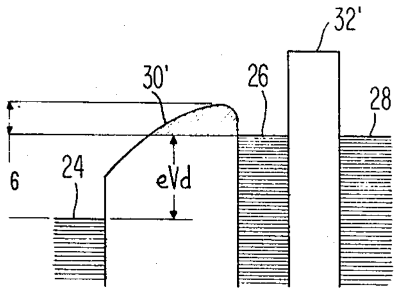
FIGURE 12 is an energy level diagram for the condition illustrated in FIGURE 11.
Figure 11:
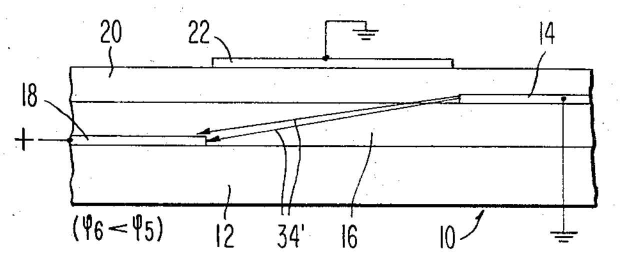
FIGURE 11 is a view substantially similar to FIGURE 9 showing the "drain" positively biased relative to the source and with the gate at the same potential as the source.

Application of a potential or bias to the device, as seen in FIGURES 11 and 12, with the drain positioned as shown relative to the source, tends to decrease the source-cadmium sulphide space charge potential barrier 30' so that current flows between source 14 and drain 18, arrows 34'. Thus, the height $\varphi 6$ is less than $\varphi 5$.

Figure 14:
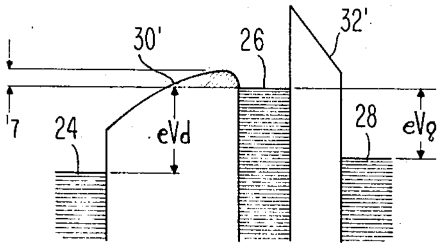
FIGURE 14 is an energy level diagram for the condition illustrated in FIGURE 13.
Figure 13:
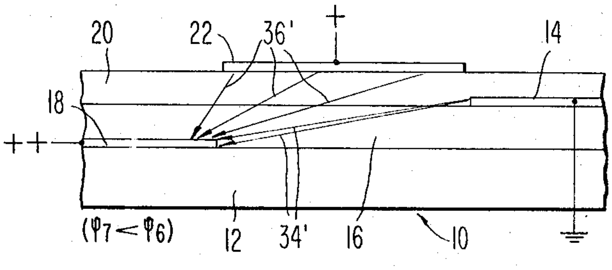
FIGURE 13 is a view similar to FIGURE 11 showing the "gate" positively biased relative to the source and with the drain more positive than the gate.
Figure 16:
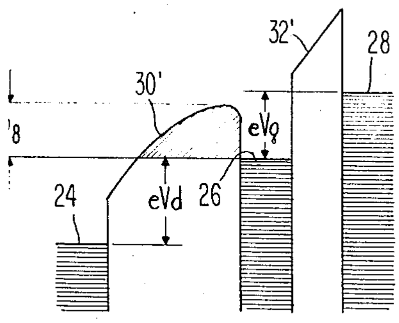
FIGURE 16 is an energy level diagram of the condition shown in FIGURE 15.
Figure 15:
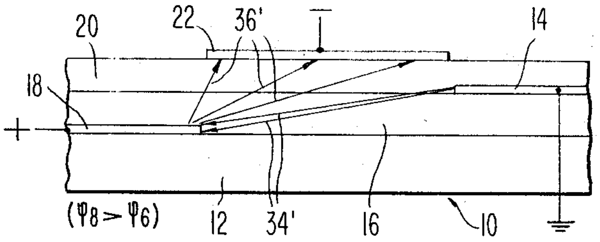
FIGURE 15 is a view similar to FIGURE 11 showing the gate biased negatively relative to the source and with the drain positive relative thereto.

In FIGURES 13 and 14 with the gate 22 positive relative to the source 14, and with the drain 18 more positive than the gate, the lines of force are additive. Thus, the space charge potential barrier of both the source and the gate 30' and 32' are lowered, FIGURE 14, thereby increasing the current flow between source and drain. In this manner the gate 22 effectively acts in the nature of a control member or grid. Thus, there is current enhancement when the forces 34', 36' are in the same direction, while there is current diminishment when the forces are opposed as in FIGURES 15 and 16.

In this latter case, with the gate electrode 22 negative relative to the drain, the potential barrier height $\varphi 8$ is raised, which reduces the current flow between the source 14 and drain 18.

It has been observed that in the operation of the foregoing apparatus that current flows between the source and drain. Applying a gate bias between the gate and the source causes field interaction between gate-source fields and drain-source fields which is sufficient to cause appreciable modulation of the current flowing between source and drain. The $G_m$ or current output of these devices is directly proportional to the width of the gate electrode when there is a fixed separation between the source and drain electrodes. Thus, with twice the width there would be twice the current produced, effectively.

Figure 17:
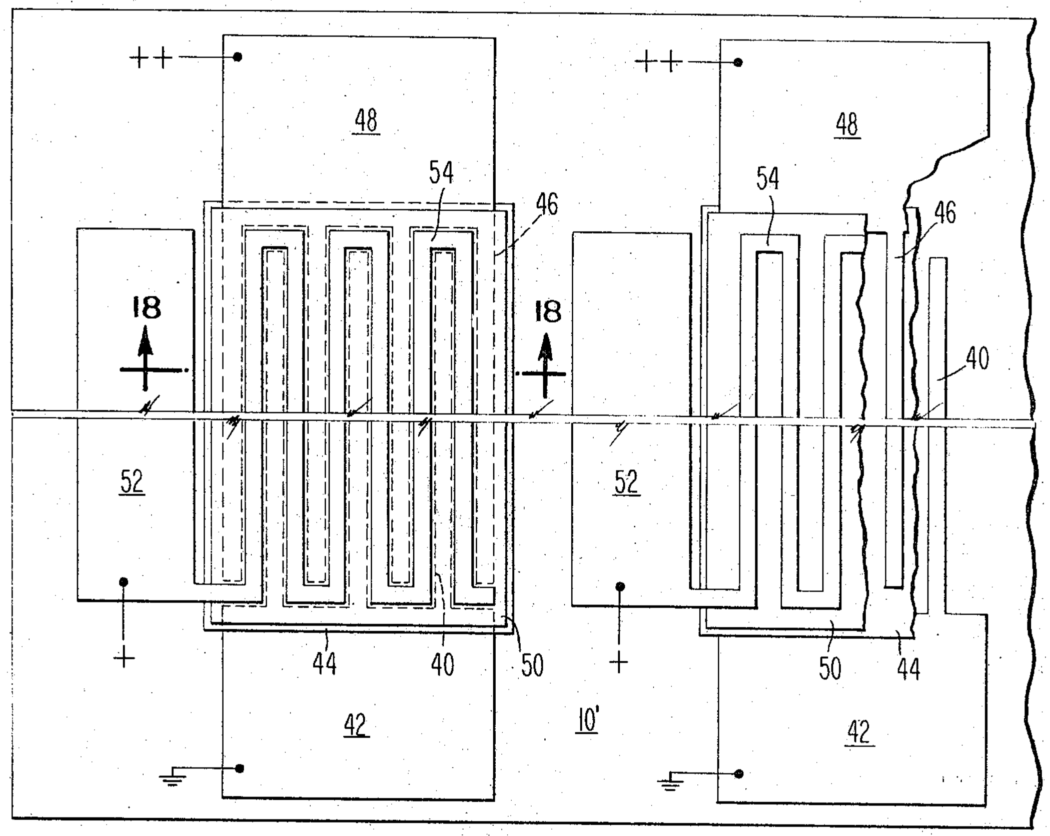
FIGURE 17 is a greatly enlarged plan view of apparatus according to the invention wherein the various electrodes are interleaved or internested with one another whereby to produce a greater amplification factor; and, FIGURE 18 is a sectional view along the line 18—18 of FIGURE 17.
Figure 18:
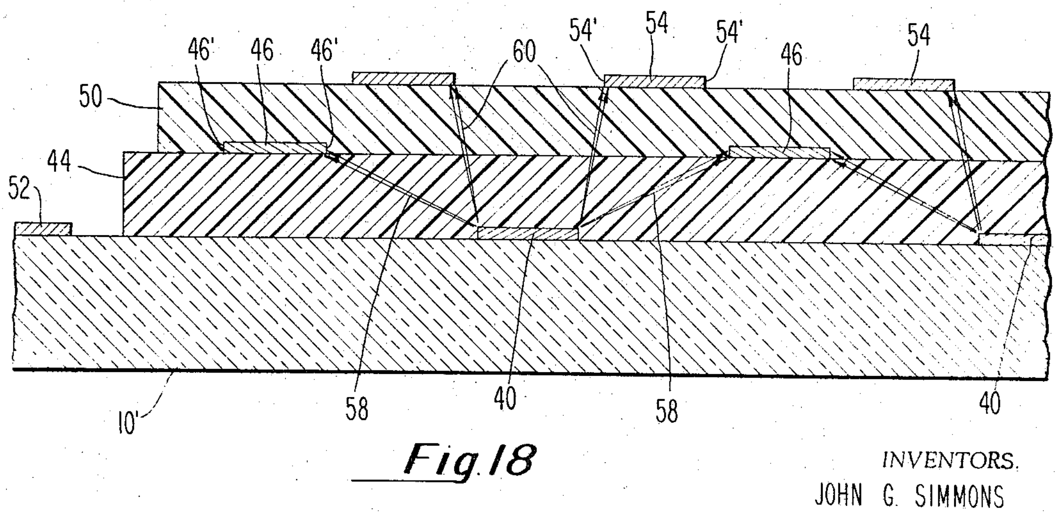

Referring now to FIGURES 17 and 18, there is shown a preferred embodiment of one form of a solid state thin film active field effect device wherein the current output is multiplied many-fold by arranging the source, drain and gate electrons in an interleaving or internesting pattern as will now be described.

On a substrate 10' a material, similar to that of the source electrode material hereinbefore described, is deposited e.g., by vacuum vapor deposition through a suitably apertured mask, forming the material into a plurality of complementary internestable finger or tine-like source electrodes 40 extending away from a base or contact member 42, FIGURE 17. Cadmium sulphide layer 44 is next disposed over the electrodes 40. A plurality of drain electrodes 46, e.g., finger or tine-line in configuration, formed as a series of projections extending away from a base contact member 48, is applied over layer 44. The two sets of finger-like electrodes 40 and 46 are disposed in confronting parallel arrangement being effectively interleaved or internested although electrically insulated from one another by the layers of insulating material. Thereafter a silicon monoxide layer 50 somewhat thinner than layer 44 is applied to the assembly so as to completely surround the drain electrodes 46. Finally, a contact member 52 is deposited on the insulating silicon monoxide layer 50 through a suitably apertured mask so as to form a substantially continuous, sinuous, serpentine conductor 54 extending away therefrom. So that the edge effects may be used to greatest advantage the serpentine conductor 54 is arranged so that it zig-zags its way in an interleaved or internested fashion between the confronting internested parallel spaced apart finger-like conductors 40 and 46 as seen most clearly in FIGURE 17.

Since the edges 46' and 54' are believed to be the predominately active areas of the source-drain current flow mechanism it is seen that the apparatus of FIGURES 17 and 18 is capable of multiplying the so-called "edge effect" by a rather significant factor. Also, the configuration of FIGURES 17 and 18 produces effectively longer "edges by the fact of the conductors being interleaved or internested thereby increasing the amplification factor many-fold. The energy level diagram of FIGURE 6 exemplifies the conductors illustrated in FIGURE 18 with the applied biases as shown.

As seen in FIGURE 18, the source-drain, source-gate fields or the direction in which the electrons move is shown by the arrows 58 and 60 respectively. It is also seen by reference to FIGURE 17 that the apparatus lends itself to simple fabrication techniques. Thus, the pattern of the left side of FIGURE 17 can be reproduced i.e., doubled, tripled, etc., as seen in the plan view of the pattern on the right side of FIGURE 17.

There has thus been described a novel thin-film analog device which is compatible with thin-film integrated circuitry and which is capable of being fabricated simply, easily, and efficiently in a form which permits an extremely high degree of electrode packing density and with operating voltages in the range of 10 volts. The apparatus is extremely rugged by nature unlike its vacuum tube counterpart and thus is relatively unaffected by vibration and shock.

What is claimed is:

1. Solid state field effect apparatus comprising,
a high temperature substrate of electrically insulating material,
a conductive layer disposed on said substrate,
a relatively thick semiconductor layer disposed on said substrate and covering said conductive material layer thereon,
a conductive material layer disposed on said semiconductor layer and being laterally spaced from said first mentioned conductive layer such that said conductive layers effectively are disposed on opposite sides of said semiconductor layer,
means for applying electrical potentials of opposite polarities to said conductive material layers producing an electrical field in said semiconductor layer and providing a transverse component of electron flow perpendicular to said conductive layers,
a relatively thin electrically insulating layer disposed over said last named conductive material layer and said semiconductor layer,
a conductive material layer disposed and overlying said insulating layer and arranged in a manner substantially bridging the lateral space separating the first two conductive material layers,
means for applying suitable electrical potential to said last named conductive material layer thereby to produce a control field in said insulating layer extending between the two first named conductive material layers,
said insulating layer upon the production of said electrical field therein being effective as a blocking barrier preventing the injection of electrons from said last named conductive material layer into said semiconductor layer and acting to control the transverse component of electron flow through the bulk of the semiconductor material layer between the first and second mentioned conductive material layers.

2. Solid state field effect apparatus comprising,
a high temperature substrate of electrically insulating material,
a conductive layer from one to three thousand angstroms thick disposed on said substrate,
a relatively thick semiconductor layer one micron thick disposed on said substrate and covering said conductive material layer thereon,
a conductive material layer from one to three thousand angstroms thick disposed on said semiconductor layer and being laterally spaced from said first mentioned conductive layer such that said conductive layers effectively are disposed on opposite sides of said semiconductor layer,
means for applying electrical potentials of opposite polarities to said conductive material layers producing an electrical field in said semiconductor layer and providing a transverse component of electron flow, perpendicular to said conductive layers,
a relatively thin electrically insulating layer one to two angstroms thick disposed over said last named conductive material layer and said semiconductor layer, a conductive material layer one to three thousand angstroms thick disposed and overlying said insulating layer and arranged in a manner substantially bridging the lateral space separating the first two conductive material layers, means for applying suitable electrical potential to said last named conductive material layers thereby to produce a control field in said insulating layer extending between the two first named conductive material layers, said insulating layer upon the production of said electrical field therein being effective as a blocking barrier preventing the injection of electrons from said last named conductive material layer into said semiconductor layer and acting to control the transverse component of electron flow through the bulk of the semiconductor material layer between the first and second mentioned conductive material layers.

3. Solid state field effect electron apparatus comprising, a first metal material layer including a plurality of finger or tine-like projecting portions, a second metal material layer also including a plurality of finger or tine-like projecting portions, the projecting portions of said first metal material layer being effectively internested with but laterally spaced and separated from the projecting portions of the second metal material layer, an electrically insulating material layer of high resistivity interposed between said metal material layers in ohmic contact therewith and separating the first and second metal material layers in two planes so as to effectively insulate said first metal material layer from said second metal material layer, an electron blocking layer of insulating material in non-ohmic contact with at least one of said metal material layers and in contact with the first insulating layer, and an additional metal material layer disposed on said blocking layer and including portions thereof effectively internested with the said material layers and electrically insulated from said metal layers and arranged so as to bridge the lateral space separating said first and second metal layers and effective upon the application of electrical potentials to each of said metal material layers to produce aiding electronic fields between said metal layers thereby to control the transfer and migration of electrons between the first and second metal material layers.

4. Solid state field effect electron apparatus comprising, a substrate of high temperature resistant electrically insulating material, a first metal material layer disposed on said substrate and including a plurality of finger or tine-like projecting portions, a second metal material layer also including a plurality of finger or tine-like projecting portions, the projecting portions of said first metal material layer effectively internested with and electrically insulated and laterally spaced from the projecting portions of the second metal material layer, an electrically insulating material layer interposed between said metal material layers in ohmic contact therewith effectively electrically insulating said first metal material layer from said second metal material layer, an electron blocking layer of insulating material in non-ohmic contact with at least one of said metal material layers and in contact with the first insulating layer, an additional metal material layer disposed upon said electron blocking layer including a portion thereof effectively internesting in serpentine fashion with the last named metal material layers and being electrically insulated from said last named layers, and means applying suitable electrical potentials to said metal material layers effective to produce electrical fields in an aiding direction between said metal layers thereby to control the transfer and migration of electrons between the first and second metal material layers.

5. Solid state field effect electron apparatus comprising, a substrate of high temperature resistant electrically insulating material, a first metal material layer one to three thousand angstroms in thickness disposed on said substrate and including a plurality of finger or tine-like projecting portions, a second metal material layer one to three thousand angstroms in thickness and also including a plurality of finger or tine-like projecting portions, the projecting portions of said first metal material layer effectively internested with and laterally spaced from the projecting portions of the second metal material layer, an electrically insulating high resistive material layer one micron in thickness in ohmic contact with said metal material layers in a manner effectively electrically insulating said first metal material layer from said second metal material layer, an electron blocking layer of insulating material one to two thousand angstroms in thickness in non-ohmic contact with at least one of said metal material layers and in contact with the first insulating layer, and an additional metal material layer one to three thousand angstroms in thickness including a serpentine extension effectively internested with the last named metal material layers and electrically insulated from said last named layers, means for electrically energizing each of said metal material layers effective thereby to control the transfer and migration of electrons between the first and second metal material layers.

References Cited by the Examiner

UNITED STATES PATENTS

| | | | |
|---|---|---|---|
| 2,305,758 | 12/1942 | Berghaus et al. | 204—192 |
| 2,524,033 | 10/1950 | Bardeen | 179—171 |
| 2,754,259 | 7/1956 | Robinson et al. | 204—192 |
| 3,191,061 | 6/1965 | Weimer | 307—88.5 |
| 3,204,161 | 8/1965 | Witt | 317—235 |
| 3,213,299 | 10/1965 | Rogers | 307—88.5 |

JOHN W. HUCKERT, *Primary Examiner.*

M. EDLOW, *Assistant Examiner.*